United States Patent
Kataoka et al.

(10) Patent No.: US 8,254,663 B2
(45) Date of Patent: Aug. 28, 2012

(54) ULTRAFINE LITHOGRAPHY PATTERN INSPECTION USING MULTI-STAGE TDI IMAGE SENSORS WITH FALSE IMAGE REMOVABILITY

(75) Inventors: Akira Kataoka, Kanagawa (JP); Ikunao Isomura, Kanagawa (JP); Ryoichi Hirano, Tokyo (JP); Nobutaka Kikuiri, Tokyo (JP); Susumu Iida, Kanagawa (JP)

(73) Assignees: Kabushiki Kaisha Toshiba, Tokyo (JP); NEC Corporation, Tokyo (JP)

( * ) Notice: Subject to any disclaimer, the term of this patent is extended or adjusted under 35 U.S.C. 154(b) by 730 days.

(21) Appl. No.: 12/395,840

(22) Filed: Mar. 2, 2009

(65) Prior Publication Data

US 2009/0238446 A1 Sep. 24, 2009

(30) Foreign Application Priority Data

Mar. 18, 2008 (JP) ................. 2008-068918

(51) Int. Cl.
*G06K 9/00* (2006.01)
(52) U.S. Cl. ........ 382/144; 382/145; 382/260; 382/264; 382/312
(58) Field of Classification Search .......... 382/144–145, 382/149, 260, 264, 312
See application file for complete search history.

(56) References Cited

U.S. PATENT DOCUMENTS

| | | | | |
|---|---|---|---|---|
| 5,041,912 A | * | 8/1991 | Schlig et al. | 382/262 |
| 5,101,266 A | * | 3/1992 | Schlig et al. | 358/505 |
| 5,440,648 A | * | 8/1995 | Roberts et al. | 382/141 |
| 5,742,058 A | * | 4/1998 | Pantigny et al. | 250/370.08 |
| 6,175,645 B1 | * | 1/2001 | Elyasaf et al. | 382/147 |
| 7,171,038 B2 | * | 1/2007 | Adler et al. | 382/149 |
| 7,227,984 B2 | * | 6/2007 | Cavan | 382/145 |
| 2002/0001759 A1 | * | 1/2002 | Ohashi et al. | 430/5 |
| 2004/0175028 A1 | * | 9/2004 | Cavan | 382/145 |
| 2004/0184576 A1 | * | 9/2004 | Meyer | 378/58 |
| 2006/0262147 A1 | * | 11/2006 | Kimpe et al. | 345/690 |
| 2008/0101549 A1 | * | 5/2008 | Eliasson | 378/207 |

FOREIGN PATENT DOCUMENTS

| | | | |
|---|---|---|---|
| JP | 5-312955 | | 11/1993 |
| JP | 6-90407 | | 3/1994 |
| JP | 06090407 | * | 3/1994 |
| JP | 10-253763 | | 9/1998 |
| JP | 11-89799 | | 4/1999 |

(Continued)

OTHER PUBLICATIONS

Japanese Office Action mailed on Jun. 19, 2012, issued for JP Application No. 2010-115066 (with English translation).

*Primary Examiner* — Jayesh A Patel
(74) *Attorney, Agent, or Firm* — Oblon, Spivak, McClelland, Maier & Neustadt, L.L.P.

(57) ABSTRACT

A workpiece inspection apparatus includes a measured image generator unit configured to measure a pattern of a workpiece and generate a measured image; and a comparator unit configured to compare the measured image to a fiducial image, wherein said measured image generator unit includes a light-receiving device having an interconnection of two or more time delay integration (TDI) sensors each being arranged by two or more line sensors each being arranged by two or more pixels, for generating as the measured image an average value of pixel values excluding an abnormal pixel value from pixels of each TDI sensor with respect to a position of the pattern of the workpiece.

5 Claims, 9 Drawing Sheets

FOREIGN PATENT DOCUMENTS

| | | |
|---|---|---|
| JP | 2002-289130 | 10/2002 |
| JP | 2004-96252 | 3/2004 |
| JP | 2005-134181 A | 5/2005 |
| JP | 2005-292122 | 10/2005 |
| JP | 2006-10567 | 1/2006 |
| JP | 2008-45779 | 2/2008 |

* cited by examiner

ULTRAFINE LITHOGRAPHY PATTERN INSPECTION USING MULTI-STAGE TDI IMAGE SENSORS WITH FALSE IMAGE REMOVABILITY

CROSS-REFERENCE TO RELATED APPLICATION(S)

Priority is claimed to Japanese Patent Application No. 2008-068918, filed Mar. 18, 2008, the disclosure of which is incorporated herein by reference.

FIELD OF THE INVENTION

The present invention relates generally to pattern inspection technologies and, more particularly, to a method and apparatus for inspecting ultrafine patterns of a workpiece, such as a photomask, wafer or substrate, which is used in the manufacture of highly integrated semiconductor devices and/or liquid crystal display (LCD) panels.

DESCRIPTION OF RELATED ART

In ultralarge-scale integrated (ULSI) circuit devices, such as one-gigabit (1 Gb) class dynamic random access memory (DRAM) chips, circuit patterns are becoming from submicron to nanometer orders in minimum feature sizes thereof. In the manufacture of such ULSI devices, production yields can decrease due to some causes, one of which must be the presence of defects in a photo-mask to be used in the process of exposing and transferring an ultrafine pattern onto semiconductor wafers by use of photolithography techniques. In particular, as ULSI patterns to be formed on semiconductor wafers decrease in size dimensions, pattern defects that must be detected by inspection tools become smaller in size accordingly. In view of this, an advanced pattern inspection apparatus capable of checking ULSI chips for such ultrasmall defects has been developed.

Regarding LCD devices, recent advances in multimedia technology result in LCD panels becoming larger in substrate size to have a display area of 500 mm by 600 mm or greater and also becoming smaller in minimal line-width and feature size of patterns of thin-film transistor (TFT) circuitry to be formed on an LCD substrate. It is thus required to perform inspection of ultrasmall pattern defects extensively. This brings an urgent need to develop a high-accuracy workpiece inspection apparatus capable of efficiently checking for defects this large-area LCD pattern and a photomask for use in the manufacture of such large-area LCD panels in a short period of time.

Prior known pattern inspection tools are faced with a problem as to the lack of an ability to sufficiently perform the required inspection. One reason of this is that false images, which cause virtual presence of tiny patterns, are created at photoelectric sensors for acquisition of the image of a workpiece under inspection due to the presence of cosmic radiation rays or electrical noises internally occurring in the sensors. A technique for avoiding this false image-related problem is disclosed in Published Japanese Patent Application No. H05-312955, which employs a sensor for detecting collision of cosmic rays with image sensors to thereby remove baneful influence of such cosmic rays. Unfortunately, this advantages of the prior art technique does not come without accompanying penalties: an increase in apparatus configuration, an increase in structural complexity, and a failure to remove the influence of internal sensor noises.

SUMMARY OF THE INVENTION

It is therefore an object of the present invention to provide a new and improved workpiece pattern inspection technique with increased accuracy. Another object of this invention is to provide a method and apparatus for performing workpiece inspection capable of excluding temporarily generated false images of an actually measured pattern image.

In accordance with one aspect of this invention, a workpiece inspection apparatus is provided which includes a measured image generator unit configured to measure a pattern of a workpiece and generate a measured image; and a comparator unit configured to compare the measured image to a fiducial image, wherein said measured image generator unit includes a light-receiving device having an interconnection of two or more time delay integration (TDI) sensors each being arranged by two or more line sensors each being arranged by two or more pixels, for generating as the measured image an average value of pixel values excluding an abnormal pixel value from pixels of each TDI sensor with respect to a position of the pattern of the workpiece.

In accordance with another aspect of the invention, a workpiece inspection apparatus is provided, which includes a measured image generator unit configured to measure a pattern of a workpiece and generate a measured image, and a comparator unit for comparison of the measured image to a fiducial image. The measured image generator unit includes a light-receiving device having an interconnection of two or more TDI sensors, each of which is arranged by two or more line sensors, each being arranged by two or more pixels. The measured image generator unit generates as the measured image the average value of pixel values excluding as the abnormal pixel value a pixel value greater than a fiducial value from pixels of each TDI sensor with respect to a position of the pattern of the workpiece.

In accordance with still another aspect of the invention, a workpiece inspection apparatus is provided which includes a measured image generator unit configured to measure a pattern of a workpiece and generate a measured image, and a comparator unit configured to compare the measured image to a fiducial image. The measured image generator unit includes a light-receiving device which has an interconnection of two or more TDI sensors each be arranged by two or more line sensors, each of which is arranged by two or more pixels, uses as a fiducial value a sum of an average value of pixel values and a predetermined value and generates as the measured image the average value of pixel values excluding as the abnormal pixel value a pixel value greater than the fiducial value from pixels of each TDI sensor with respect to a position of the pattern of the workpiece.

In accordance with a further aspect of the invention, a workpiece inspection apparatus is provided which includes a measured image generator unit configured to measure a pattern of a workpiece and generate a measured image, and a comparator unit configured to compare the measured image to a fiducial image. The measured image generator unit includes a light-receiving device which has three or more of the TDI sensors, and generates as the measured image the average value of pixel values excluding as the abnormal pixel value a pixel value such that an absolute value of a difference between the pixel value and an average value of pixel values of all the three or more TDI sensors at the position is greater than a fiducial value, from pixels of each TDI sensor with respect to a position of the pattern of the workpiece.

In accordance with another further aspect of the invention, a workpiece inspection apparatus is provided which includes a measured image generator unit configured to measure a pattern of a workpiece and generate a measured image, and a comparator unit configured to compare the measured image to a fiducial image. The measured image generator unit includes a light-receiving device which has three or more of the TDI sensors. when calculating as the measured image the average value of pixel values, if an average value difference which is an absolute value of a difference between a pixel value of an i-th TDI sensor and an average value calculated using pixel values of first to (i−1)th TDI sensors is less than or equal to a fiducial value, the measured image generator unit sets as a new pixel value an average value of a pixel value of the i-th TDI sensor and pixel values of the first to (i−1)th TDI sensors, and if the average value difference is not less than the fiducial value then the measured image generator unit performs processing for preventing updating of the average value as the abnormal pixel value. And the measured image generator unit repeats execution of this processing with respect to pixels of all the TDI sensors to thereby obtain an average value and then lets this average value be the measured image.

In accordance with another further aspect of the invention, a workpiece inspection method is provided, which includes measuring a pattern of a workpiece using a light-receiving device including an interconnection of two or more time delay integration (TDI) sensors each being arranged by two or more line sensors each being configured from two or more pixels; generating as a measured image an average value of pixel values excluding an abnormal pixel value from pixels of each TDI sensor with respect to a position of the pattern of the workpiece; and comparing the measured image to a fiducial image to output a compared result.

According to at least one of these invention, it is possible to perform accurate workpiece pattern inspection. Another advantage of the at least one of these invention lies in its ability to perform pattern inspection capable of excluding temporarily created false images of a measured image of a workpiece being tested.

DETAILED DESCRIPTION OF THE INVENTION

Figure 1:
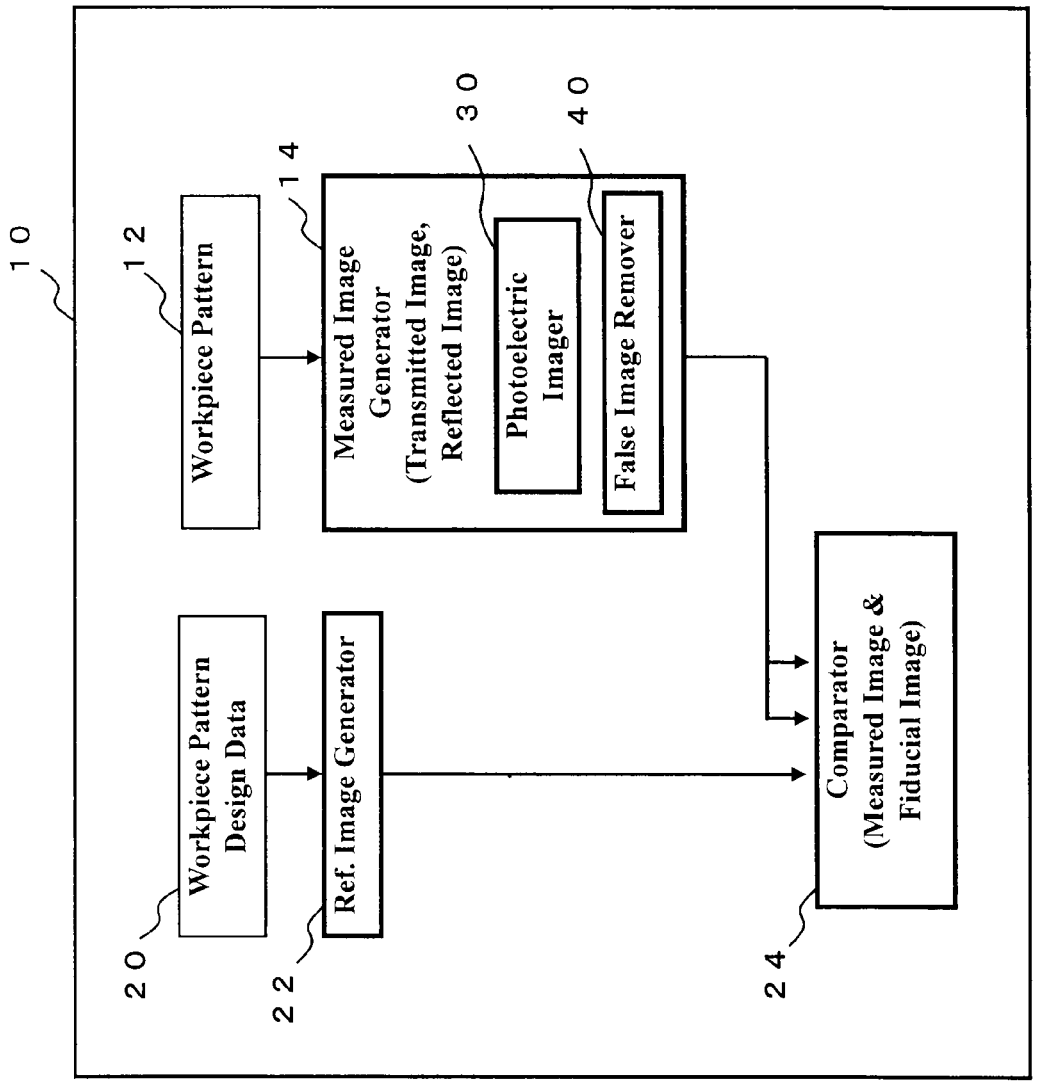
FIG. 1 is a block diagram for explanation of a workpiece inspection apparatus and a workpiece inspection method in accordance with embodiments of this invention.

Currently preferred embodiments of this invention will be described in detail with reference to the accompanying figures of the drawing below.

Workpiece Inspection Basics

See FIG. 1, which shows in block diagram form a principal data flow in workpiece inspection to be performed by a pattern inspection apparatus 10 embodying the invention. The workpiece inspection apparatus 10 is the one that performs inspection of a circuit pattern 12 of a workpiece under testing, such as a photomask, wafer or substrate of liquid crystal display (LCD) panel. The workpiece inspection apparatus 10 is especially the one that checks the workpiece pattern 12 for defects by generating a measured image, which is for use as an object to be compared, while excluding therefrom unwanted influenceability of false images of an output image. These false images are locally created temporarily due to the presence of radiation rays, such as cosmic rays, or internal production of electrical noises in sensors. The workpiece inspection apparatus 10 includes a measured image generation unit 14, which measures transmitted light and/or reflection light of the workpiece pattern 12 to thereby generate a measured image of any one of a transmitted image and a reflection image or both of them. The inspection apparatus 10 also includes a reference image generation unit 22, which processes design data 20 of the workpiece pattern to thereby produce a referencing image that resembles the measured image.

The workpiece inspection apparatus 10 has a comparison unit 24, which receives a measured image from which any false images are removed away and compares this false image-excluded measured image to the reference image to determine whether a difference therebetween is in excess of a predetermined value: if the difference exceeds this value, then decide that the measured image must contain defects therein. The comparator 24 uses the reference image which was produced by the reference image generator 22 as a standard or fiducial image to perform die-to-database (D-DB) comparison with the false image-excluded measured image. Alternatively, the comparator 24 uses as the fiducial image a measured image which is obtained by the measured image generator 14 through image pickup of the same pattern of the workpiece at a different location on its surface and from which any possible false images are removed, thereby performing die-to-die (D-D) comparison with the false image-excluded measured image.

Measured Image Generator

Figure 4:
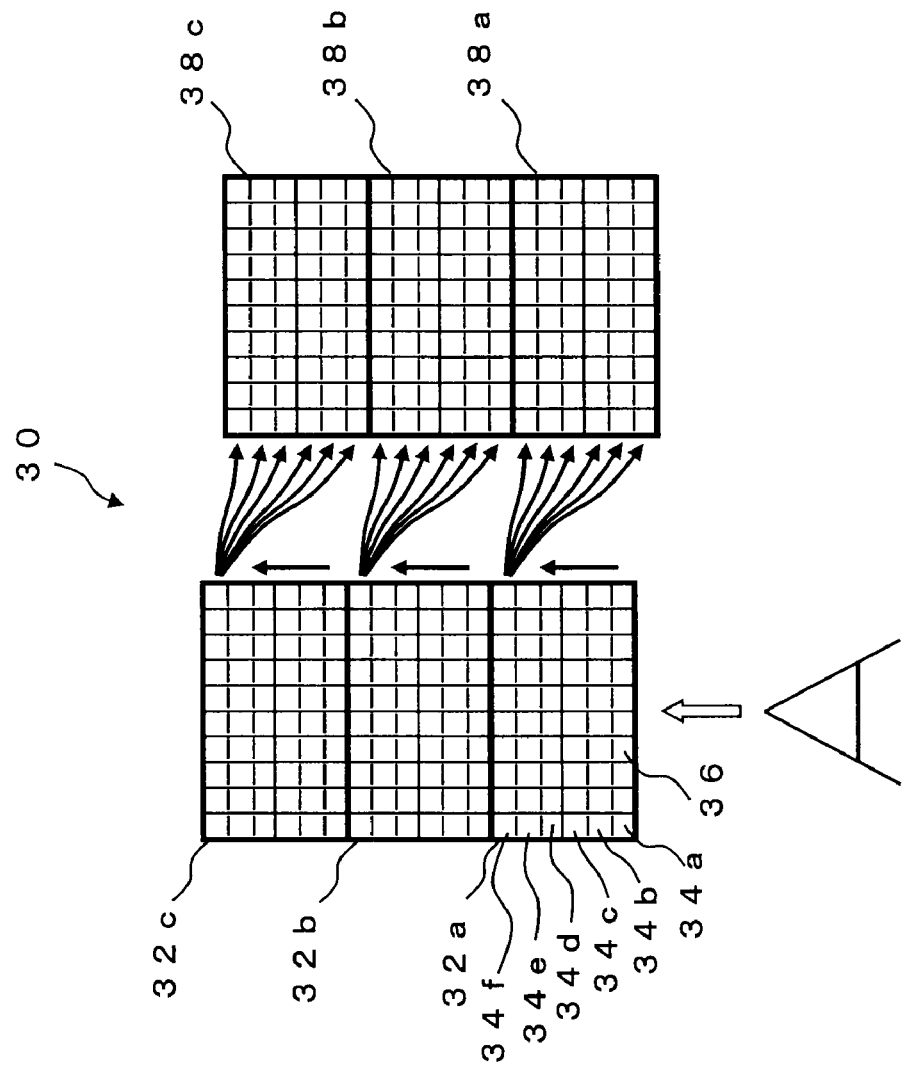
FIG. 4 is a diagram for explanation of the functionality of a light-receiving unit having a plurality of time delay integration (TDI) image sensors.

The measured image generator unit 14 includes a light-receiving device 30, such as a photoelectric imaging device, and a false image removing unit 40. The light-receiving device 30 has a photosensitive module which is generally made up of a serial combination of a plurality of time delay integration (TDI) image sensors 32 as shown in FIG. 4. Typical examples of these TDI sensors 32 are photodiodes, charge-coupled device (CCD) photo-sensing elements and like sensors, which are for integrating a packet of electrical charge carriers by an integration stage number in the charge transfer direction. Use of the TDI sensors 32 makes it possible to improve the sensitivity in proportion to the stage number, thereby reducing noises otherwise occurring due to element variations and/or irregularities of illumination light brightness.

The false image remover 40 is operatively responsive to receipt of an output value of an image that was picked up by each of the TDI sensors 32, for performing comparison of it with the fiducial value and applying thereto arithmetic processing, such as average value calculation or the like, to thereby remove therefrom an abnormally large output value which is not normally detected from the intensity of light, i.e., an abnormal pixel value that exceeds the fiducial value. By doing this, any possible false or "fake" images are moved away. Note here that the fiducial value is obtained by taking into consideration either the normally non-detected large output values or those values which are obtained through various arithmetic computation processes, e.g., the average value of all output values involved.

Workpiece Inspection Apparatus

Figure 2:
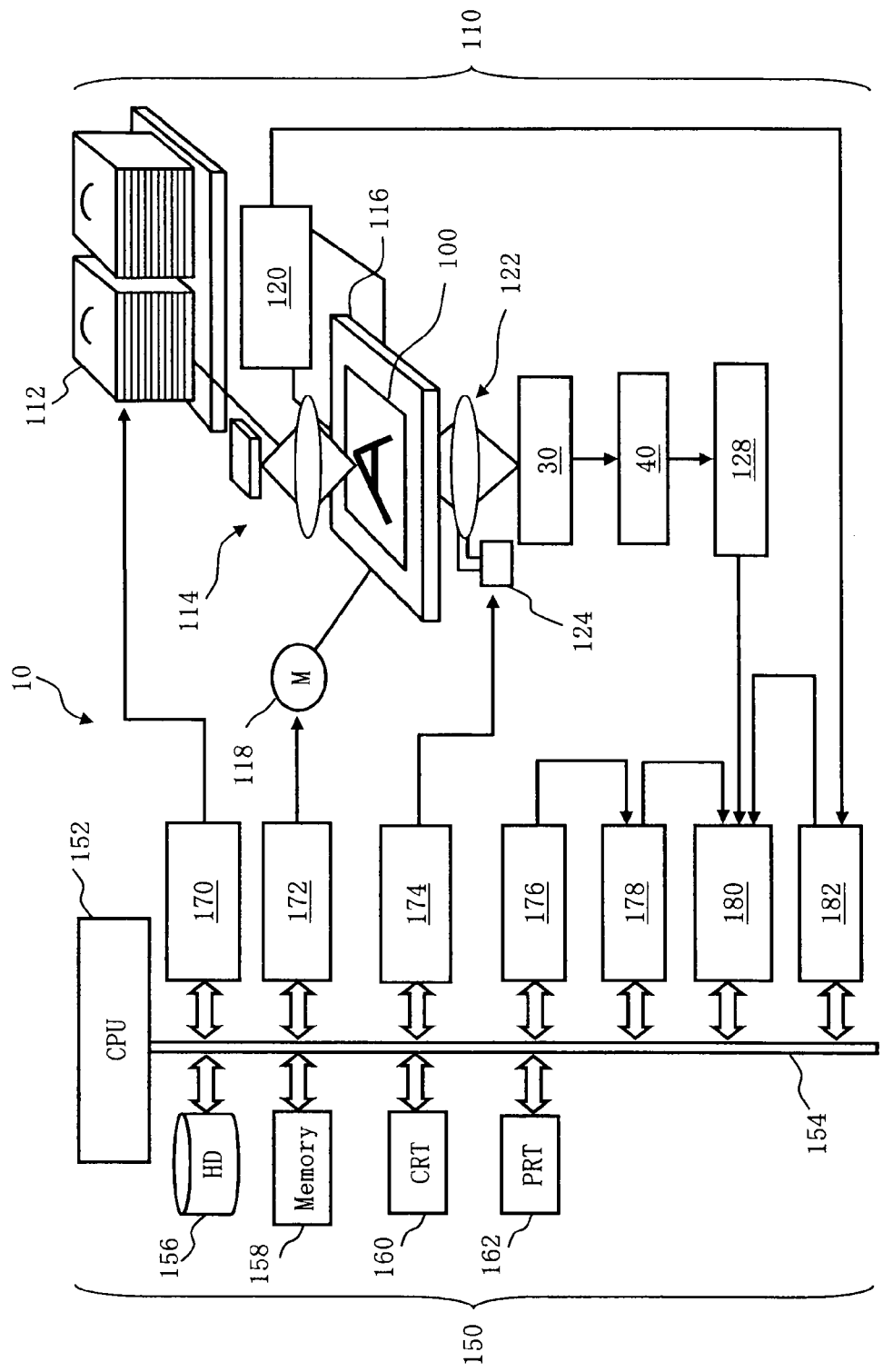
FIG. 2 is a diagram showing an internal configuration of the workpiece inspection apparatus embodying the invention.

Turning to FIG. 2, an internal configuration of the workpiece inspection apparatus 10 is shown. This workpiece inspection tool 10 is the one that checks a workpiece 100 for pattern defects. An example of the workpiece is a photomask or a silicon wafer or else. The workpiece inspection tool 10 includes an optical image acquiring unit 110 and a system control unit 150. The optical image acquisition unit 110 is generally made up of an automatic loader 112, an illumination device 114 for emitting illumination light, a movable table structure 116, which is slidable in directions of X and/or Y axis while rotating about Z axis by an angle θ, an electrical motor 118 for driving the X-Y-θ table 116, a laser-used length measurement system 120, a magnifying optical system 122, a piezoelectric element 124, the light-receiving device 30 having the TDI sensors 32 for sensing received light rays which passed through or reflected from the workpiece surface, such as CCD image sensor, photodiode array, etc., the false image removing unit 40, and a sensor circuit 128 associated therewith.

The system controller 150 includes a central processing unit (CPU) for use as a control computer, which is connected via a data transfer bus 154 to a large-capacity storage device 156, semiconductor memory 158, display device 160, printer 162, auto-loader control circuit 170, table control circuit 172, auto-focus control circuit 174, pattern generation circuit 176, reference image generation circuit 178, comparator circuit 180, position control circuit 182 and others. The false image remover 40 may alternatively be disposed within the sensor circuit 128. The pattern generator circuit 176, reference image generator circuit 178, comparator circuit 180 and positioning circuit 182 are operatively connected together as better shown in FIG. 2.

The measured image generator 14 of FIG. 1 may be configured from the optical image acquisition unit 110 shown in FIG. 2. The reference image generator 22 is configurable from the pattern generator circuit 176 and reference image generator circuit 178. The comparator unit 24 is arrangeable by the comparator circuit 180. The workpiece inspection apparatus 10 of the illustrative embodiment may be designed to include other known functional units or components, which are not specifically illustrated herein.

Operation of Image Acquisition Unit

The workpiece 100 to be inspected, such as a mask for light exposure or photolithography, is conveyed by the auto-loader 112 which is driven by the auto-loader control circuit 170 and is then loaded into a processing chamber (not shown) of the workpiece inspection tool 10 so that it is placed onto the XYθ table 116 in an automated way. The workpiece 100 has a top surface which is irradiated with incoming light from the illumination device 114 overlying this workpiece in order to obtain transmitted light, and has a back surface onto which light is irradiated from its downside in order to obtain reflected light, although not specifically shown in FIG. 2. Disposed beneath the workpiece 100 are the magnifying optical system 122, light-receiving device 30, false image remover 40 and sensor circuit 128. The transmitted light that passed through the workpiece 100 or the light reflected therefrom is guided by the magnifying optical system 122 to be focused onto the light-receiving device 30 as an optical image. The auto-focus control circuit 174 controls the piezoelectric element 124 to perform image focussing adjustment relative to the workpiece 100 in order to absorb arcuation of the workpiece 100 and fluctuation of the XYθ table 116 into Z axis, which is at right angles to X and Y axes.

Figure 3:
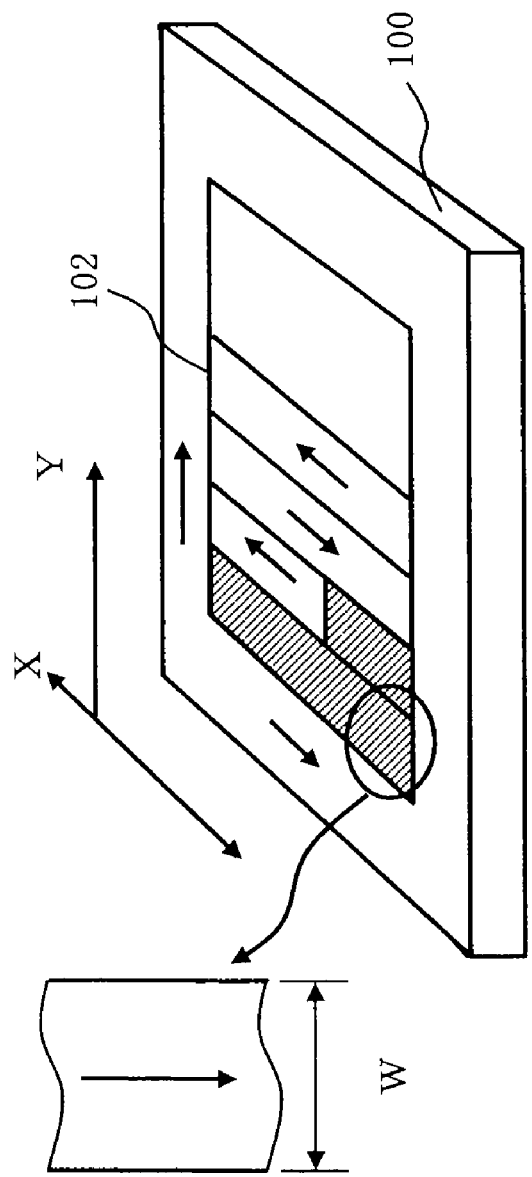
FIG. 3 is a perspective view of a workpiece under inspection for explanation of a measured image acquisition procedure.

A perspective view of the workpiece 100 is shown in FIG. 3 for explanation of a procedure of acquiring the measured image. The workpiece 100 has on its top surface an area to be inspected, which is virtually subdivided by a scan width W in Y-axis direction. More specifically, the workpiece 100's inspection area is virtually divided into a plurality of strip-like portions 102, each of which has a width corresponding to the scan width W. The XYθ table 116 is controlled so that these divided strips 102 are continuously scanned one-by-one in a serpentine fashion which follows. Firstly, the XYθ table 116 moves along the X axis so that a measured image of one strip 102 is acquired. This strip 102 is of a narrow elongate rectangle shape which has the scan width W along Y-axis direction and its length along the X-axis direction as shown in FIG. 3. The light that passed through the workpiece 100 or the light reflected therefrom travels through the magnifying optical system 122 to fall onto the light-receiving device 30. Part of the strip-like surface area of the virtually divided pattern shown in FIG. 3 is focused as a magnified optical image on the light-receiving device 30. The light-receiving device 30 continuously picks up images each having the scan width W such as shown in FIG. 3. After having acquired the image of the first strip 102, the light-receiving device 30 senses an image of second strip 102 having the scan width W while moving in the opposite direction at this time. When sensing an image of third strip 102, it acquires this image while moving in the opposite direction to that when it acquired the image of the second strip 102—that is, the direction same as that when obtained the image of the first strip 102. The scan width W may be set to about 2,048 pixels, for example.

The XYθ table 116 is driven by the table control circuit 172 under the control of CPU 152. This table becomes movable by use of a drive system having the three-axis (X-Y-θ) motor assembly 118 including three electric motors for driving the table 116 in X-axis direction, Y-axis direction and θ direction, respectively. Examples of these motors are stepper motors. A moved position of the XYθ table 116 is measured by the laser length measurement system 120. This system generates an electrical signal indicative of a present table position, which signal is then supplied to the position circuit 182. The light-receiving device 30 obtains electronic data of the same pattern by means of the plurality of TDI sensors 32. The false image remover 40 uses the electronic data of the same pattern of each TDI sensor to exclude a false image which can take place due to cosmic rays and/or electrical noises. The sensor circuit 128 outputs as a measured image the electronic data of an optical image with false images being excluded therefrom.

The measured image as output from the sensor circuit 128 is sent to the comparator circuit 180 along with output data of the position circuit 182 which indicates the position of the workpiece 100 on XYθ table 116. After having completed pattern inspection, the workpiece 100 on the XYθ table 116 is automatically ejected under control of the auto-loader control circuit 170. An example of the measured image is unsigned 8-bit data indicative of the gradation or "tone" of the brightness of each pixel.

TDI Pattern-Imaging Procedure

An internal structure of the light-receiving device 30 is shown in FIG. 4, wherein three separate TDI image sensors 32a, 32b and 32c are serially connected together. Each TDI sensor has a predetermined number, e.g., 256 or 512, of stages of line sensors 34, although six stages of line sensors 34a to 34f are shown in FIG. 4 for purposes of convenience in illustration. Each line sensor 34a, 34b, . . . , 34f has a linear array of a great number of—e.g., 1,024 or 2,048—pixels 36, although ten pixels are shown in FIG. 4 for illustration purposes only. TDI sensors 32a to 32c have buffer memories 38a to 38c, respectively. Electrical charge carriers that are produced in TDI sensor 32a, 32b, 32c is ejected or "drained" to its associated buffer memory 38a, 38b, 38c. Each buffer memory 38a, 38b, 38c is for temporary storage of the data of an image as sensed by TDI sensor 32a, 32b, 32c associated therewith.

An exemplary pattern of the workpiece 100 which is sensed by the light-receiving device 30 is shown in FIG. 4, wherein an optical image of a pattern of alphabetical letter "A" is projected onto the light-receiving device 30 while moving from its downside to upside. When doing so, the individual TDI sensor 32a, 32b, 32c of light-receiving device 30 picks up the pattern image "A", causing its produced charge carriers to sequentially transfer upward as indicated by a black-painted arrow in FIG. 4. The carriers that have reached an upper end of TDI sensor 32a, 32b, 32c are drained to its corresponding buffer memory 38a, 38b, 38c. The first stage TDI sensor 32a senses the pattern image "A" faster than the remaining, second and third TDI sensors 32b-32c so that its produced carriers are drained to the buffer memory 38a associated therewith. Then, the second stage TDI sensor 32b senses this pattern "A" to drain its produced carriers to its associated buffer memory 38b. Lastly, the third TDI sensor 32c senses this pattern "A" to drain produced carriers to its own buffer memory 38c.

Figure 5:
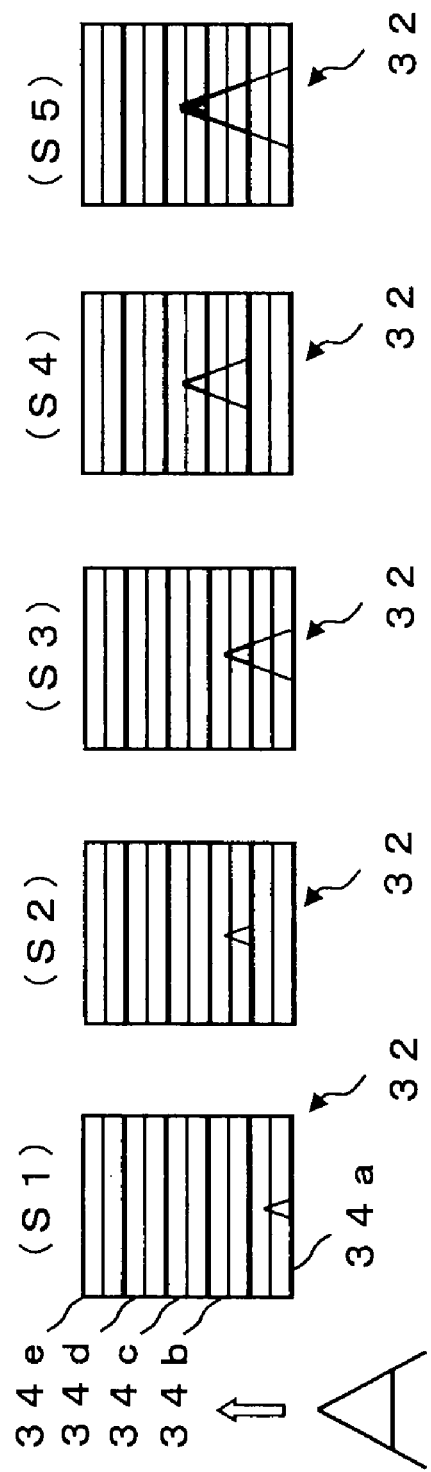
FIG. 5 is a diagram for explanation of a light receiving process of TDI sensor.

Turning to FIG. 5, there is shown a sequence of steps S1 to S5 in the process of sensing the pattern image of alphabetical letter "A", which process is performed by one TDI sensor 32 having five (5) line sensors 34a to 34e for example. At step S1, the first line sensor 34a optically picks up uppermost part of the pattern "A" and produces a corresponding amount of charge carriers, which are then accumulated therein. At the next step S2, the carriers accumulated in the first line sensor 34a are transferred to the second line sensor 34b that is placed next thereto. It is noted here that in FIG. 5, a pattern with an increased amount of received light is illustrated by a heavy line segment having a likewise thicker line width—i.e., a proportionally thickened line.

Then, at step S3, the second line sensor 34b senses a pattern of the upper end of the pattern "A" and, at the same time, the first line sensor 34a senses its following pattern part which is slightly below the upper end of this pattern "A" so that a corresponding amount of charge carriers are accumulated therein. Due to this, the upper edge of the pattern "A" of second line sensor 34b is such that its corresponding sensed carrier accumulation becomes greater in amount. Regarding the pattern which is little lower than the upper edge of the pattern "A" of the first line sensor 34a, its charge accumulation amount is not greater than that of the upper edge thereof. Subsequently, in step S4, the carriers that were accumulated in the second line sensor 34b are transferred to the third line sensor 34c at the next stage while at the same time causing the carriers stored in first line sensor 34a to be sent forth toward the second line sensor 34b.

At step S5 of FIG. 5, the third line sensor 34c senses incoming light of the upper end of the pattern "A"; at the same time, the second line sensor 34b senses a subsequent pattern part which is below the upper end of the pattern "A"; and, simultaneously, the first line sensor 34a senses a part which is further below the upper end of the pattern "A", resulting in a corresponding amount of charge carriers being accumulated therein. Accordingly, the sensed upper end of the pattern "A" of third line sensor 34c is further greater in carrier accumulation amount; the pattern slightly below the upper end of the pattern "A" of second line sensor 34b is greater in carrier accumulation; and, the pattern which is further below the upper end of the pattern "A" of first line sensor 34a is relatively less in carrier accumulation amount.

In this way, the TDI sensor 32 accumulates therein a sensed image of the workpiece pattern with the elapse of time. Accordingly, even when a temporary false image takes place in this sensor due to the presence of cosmic radiation rays or electrical noises, it is possible to lessen the influenceability thereof. In addition, in this embodiment, it is also possible by use of the plurality of TDI sensors 32 to remove or at least greatly suppress baneful influences of temporarily creatable false images.

Reference Image Generation

The design data that was used in the process of forming the pattern of the workpiece 100 is stored in the large-capacity storage device 156. The design data 20 is input from the large-capacity storage device 156 to the pattern generator circuit 176 under the control of CPU 152. This design data is subjected to pattern generating in a way which follows. The pattern generator circuit 176 converts the design data of workpiece 100 into two-value or multi-value image data indicative of the original pattern image. This original image data is sent to the reference image generator circuit 178. The reference image generator 178 applies appropriate filtering to the original image data to thereby produce an image to be referenced—say, reference image. It can be said that the measured image as obtained from the sensor circuit 128 is in the state that the filtering acts thereon owing to the image resolution characteristics of the magnifying optics 122 and aperture effects of the light-receiving device 30. In this state, a difference must exist between the measured image and the original image data on the design side. Thus, by applying the filtering by the reference image generator circuit 178 to the original image data on the design side, it becomes possible to fit or "tune" it to the measured image.

First Embodiment

Figure 6:
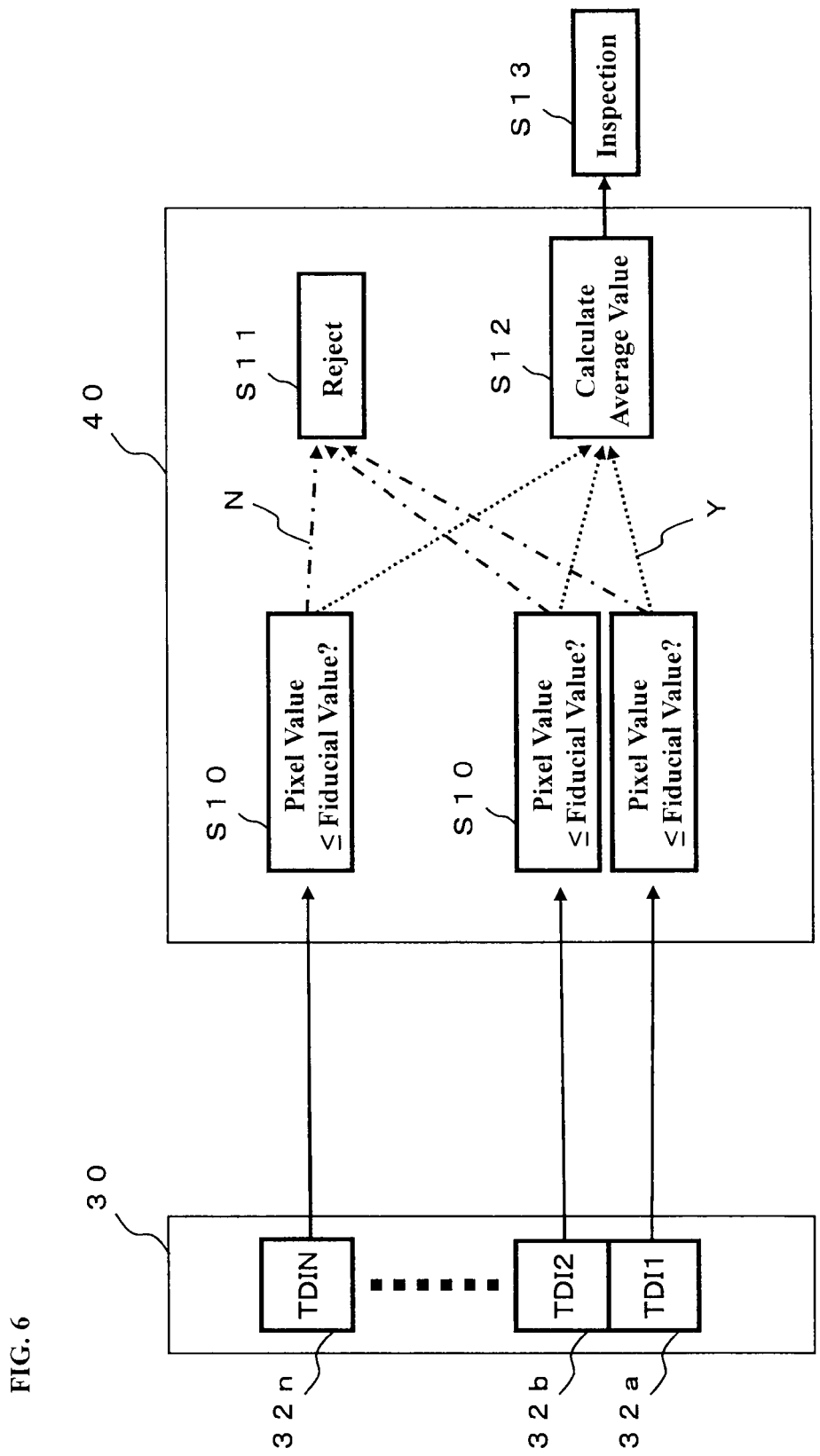
FIG. 6 is a diagram for explanation of a process for acquiring a measured image while excluding and discarding false images occurrable therein.

FIG. 6 shows a relation of the light-receiving device 30 and the false image remover unit 40 in a first embodiment of the workpiece pattern inspection. The light-receiving device 30 as used herein is arranged to have a prespecified number of TDI sensor 32a, 32b, . . . , 32n (where "n" is a positive integer), each of which includes two or more stages of line sensors. As shown in FIG. 5, the TDI sensors 32 perform measured data accumulation while transferring the measured data in a way synchronous with the movement of the pattern "A" of a workpiece.

Usually, noises are temporarily generated with respect to a local pixel due to the irradiation of cosmic rays or else. In view of this, the false image remover 40 applies arithmetic processing to this pixel's output value of abnormal brightness for removing such noises to thereby obtain a measured image. Thereafter, inspection is performed with this image being used as a measured image corresponding to the pattern of the workpiece under testing. This makes it possible to achieve high-sensitivity inspection without being influenced by false images.

An example of this noise removal processing is as follows. In the case of the light-receiving device 30 having a serial combination of N TDI sensors 32a, 32b, . . . , 32n each having n stages of line sensors 34, the cosmic ray-caused noise appearing in each TDI sensor 32i ($1 \leq i \leq n$) becomes N times greater than that occurrable at a single TDI sensor having n×N stages of line sensors. In view of this, as shown in FIG. 6, the average value of an ensemble of TDI sensors 32 each having its output value less than or equal to a predetermined fiducial value is computed with respect to a position of the pattern of the workpiece; then, inspection is performed with this average value being used as the measured image corresponding to the pattern of the to-be-tested workpiece with respect to the position of the workpiece. By executing this processing, it becomes possible to achieve high-sensitivity inspection without being influenced by false images. The fiducial value is determined by taking account of a value which is not normally measured from the strength of light or the like—for example, it is set to 240 gradation levels, or more or less.

More specifically, in the false image remover 40, an output value (pixel value) of each pixel 36 of the first TDI sensor 32a at a position of the pattern of the workpiece is compared to the fiducial value: if this output value greater than the fiducial value, it is determined to be a false image and thus discarded or "wasted." Similarly, as for the individual one of the second to N-th TDI sensors (TDI1 to TDIN) 32b to 32n at the position also, a decision is made as to whether its output value is less than or equal to the fiducial value (at step S10). Any pixel value which is not less than the fiducial value is wasted as a false image (at step S11). Those pixel values less than or equal to the fiducial value are summed together for calculation of the average value thereof (at step S12). This average value is sent to the comparator unit 24 as the measured image which contains no false images and then compared with the fiducial image for inspection to determine whether defects are present or absent with respect to the position, and the compared result is output. (at step S13). This processing is performed with respect to each position of the pattern of the workpiece.

Second Embodiment

Figure 7:
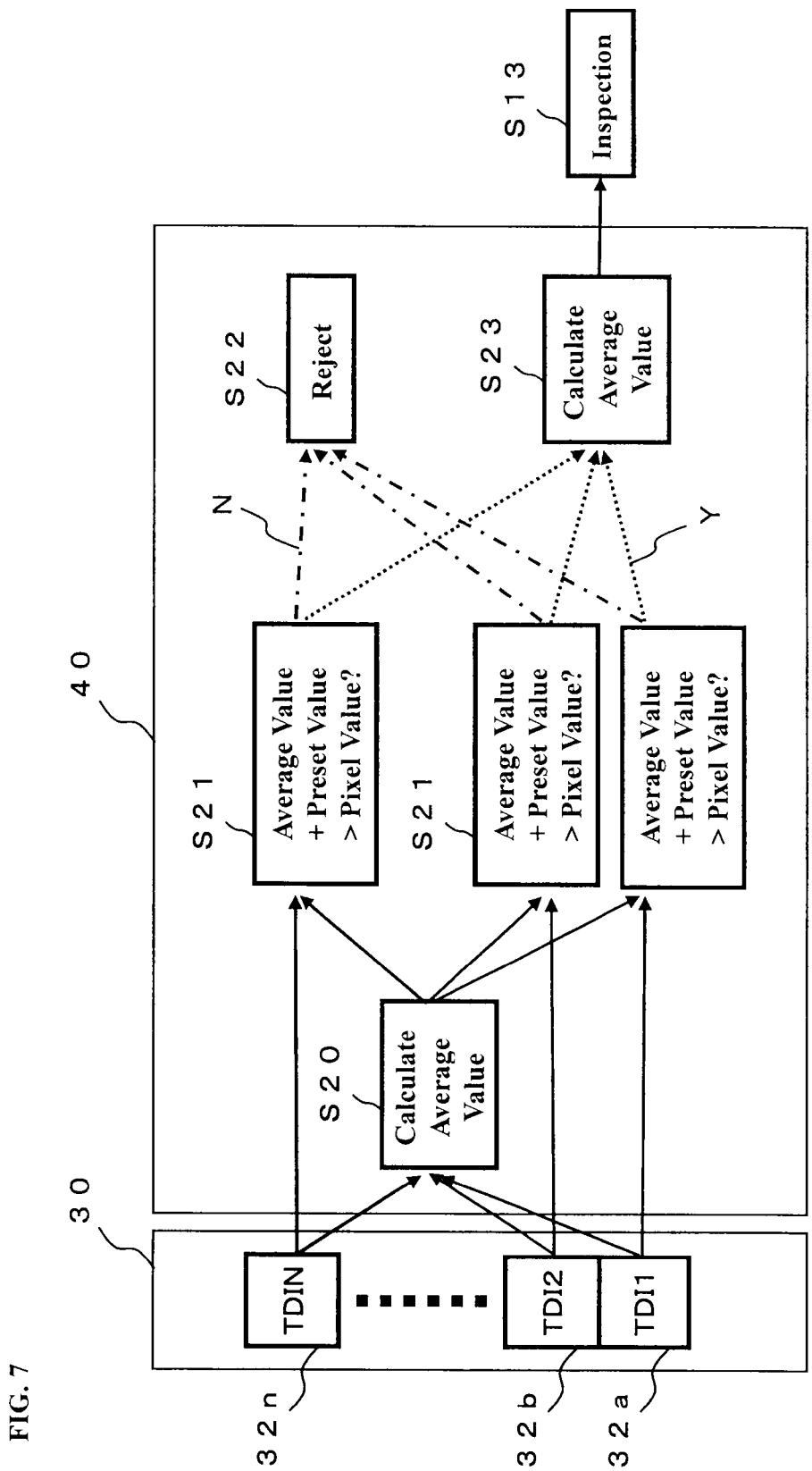
FIG. 7 is a diagram for explanation of a process of obtaining a measured image while excluding and discarding false images with the sum of an average value and a predetermined value being used as a fiducial value therefor.

See FIG. 7, which shows a second embodiment including the light-receiving device 30 which is configured from a serial combination of TDI sensors 32a, 32b, . . . , 32n each having two or more line sensors 34, wherein a specific value which is equal to a sum of the average value of outputs of all the TDI sensors 32a-32n and a prespecified value is used as the fiducial value. While in the first embodiment an attempt was made to judge whether an output value of a respective sensor is used as the measured pattern data by using a single fiducial value as a standard for each sensor output value, noises occurring due to cosmic rays significantly affect the sensor output in such a way that it becomes greater undesirably in most cases. Therefore, the second embodiment is arranged so that the specific value that is obtained by adding together the average value of outputs of all the TDI sensors 32a-32n and the prespecified value is used as the fiducial value. Regarding an output image used for workpiece pattern inspection, the average value of an ensemble of those TDI sensors each being less than or equal to the fiducial value is calculated and used as the measured image. With this arrangement, it is possible to exclude false images more precisely. The prespecified value as used herein is set by taking into consideration the stability of output characteristics of TDI sensors 32—for example, it is set at about 20 gradation levels. Thus it becomes possible to remove noises occurring due to cosmic radiation rays, which are less in energy than those in the first embodiment.

More specifically, in the false image remover 40, what is done first is to calculate the average value of output values of all the TDI sensors (TDI1 to TDIN) 32a-32n with respect to a position of the pattern of the workpiece (at step S20). A sum of the average value thus calculated and a predetermined value is obtained for use as the fiducial value, which is then compared to an output value of each pixel of the first to N-th TDI sensors 32a-32n (at step S21) If the output value is in excess of the fiducial value then this is judged to be a false image and then discarded (at step S22). The remaining pixel values each of which is less than or equal to the fiducial value are added together for calculation of their average value (at step S23). This average value is sent to the comparator unit 24 as a measured image which contains no false images at the position of the pattern of the workpiece and then compared to the fiducial image for execution of the inspection for defects with respect to the position, and the compared result is output. (at step S13). These steps are performed with respect to each position of the pattern of the workpiece.

Third Embodiment

Figure 8:
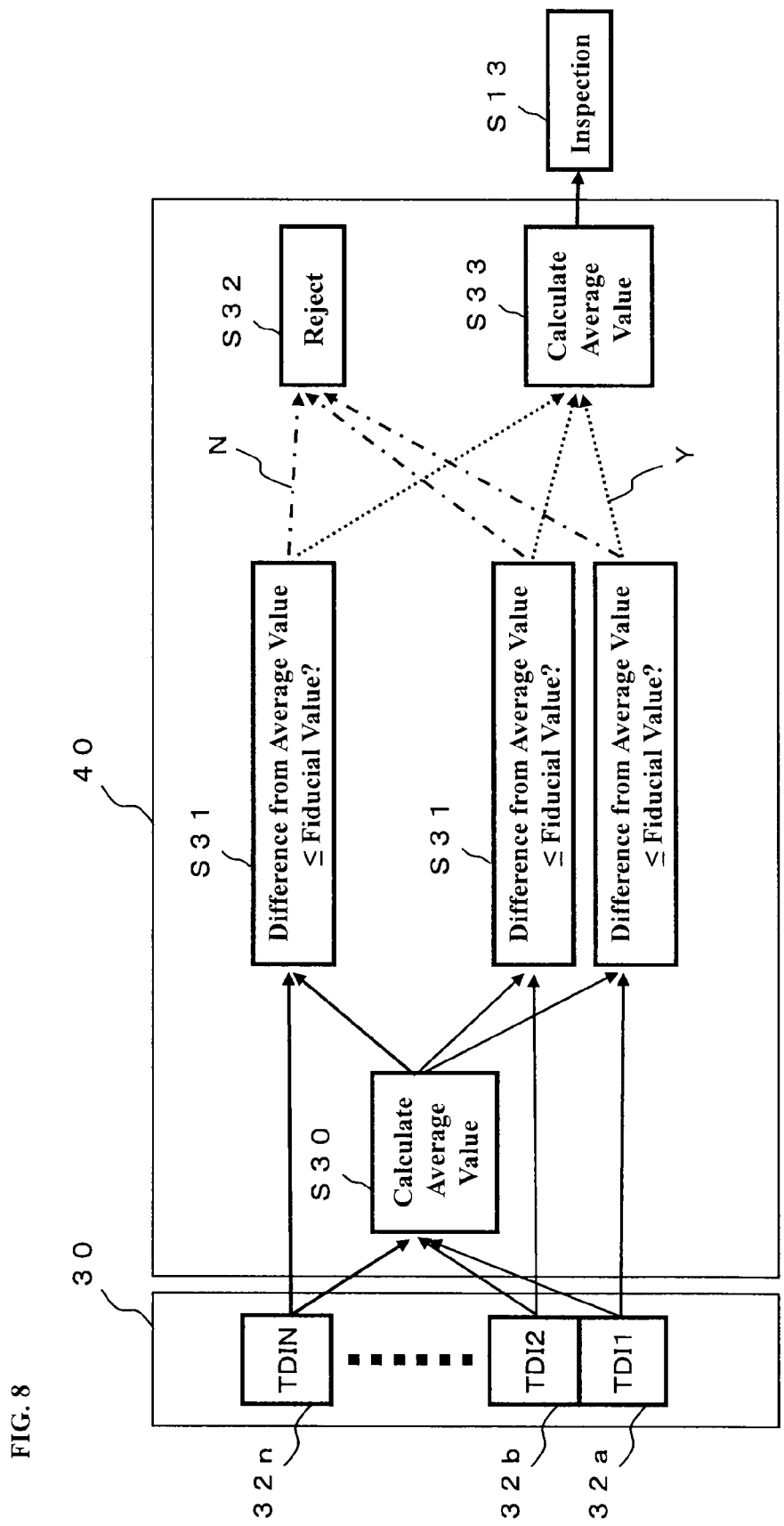
FIG. 8 is a diagram for explanation of a process of obtaining a measured image while excluding and discarding false images with the sum of an average value and a predetermined value being used as a fiducial value.

Referring next to FIG. 8, there is shown a third embodiment which includes its light-receiving device 30 having three or more TDI sensors 32a, 32b, . . . , 32n each having two or more stages of line sensors 34. In a case where the absolute value of a difference between the average value of output values of all the TDI sensors 32a-32n and an output value of the individual TDI sensor 32i becomes greater than a predetermined fiducial value, such output value is discarded and the average value of output values of the other TDI sensors 32 is used as the measured image. Whereby, it becomes possible to remove noises by means of majority decision in case a number of noise-affected TDI sensors 32 is less than the half of a total number of TDT sensors involved. The fiducial value in this case is set at about 20 gradation levels as an example.

More precisely, in the false image remover 40, the processing to be done first is to calculate the average value of output values of respective pixels 36 of the first to N-th TDI sensors (TDI1 to TDIN) 32a-32n with respect to a position of the pattern of the workpiece (at step S30). Then, the absolute value of a difference between the average value thus computed and an output value of each pixel of each TDI sensor is calculated and then compared to a predetermined fiducial value (at step S31). If this absolute value is not less than the fiducial value, it is determined that it must be a false image and then wasted (at step S32). Those pixel values each of which is less than or equal to the fiducial value are added together for calculation of their average value (at step S33). This average value is sent to the comparator unit 24 as a measured image that contains no false images and then compared with the fiducial image for inspection for pattern defects with respect to the position, and the compared result is output. (at step S13). These steps are performed with respect to each position of the pattern of the workpiece.

Fourth Embodiment

Figure 9:
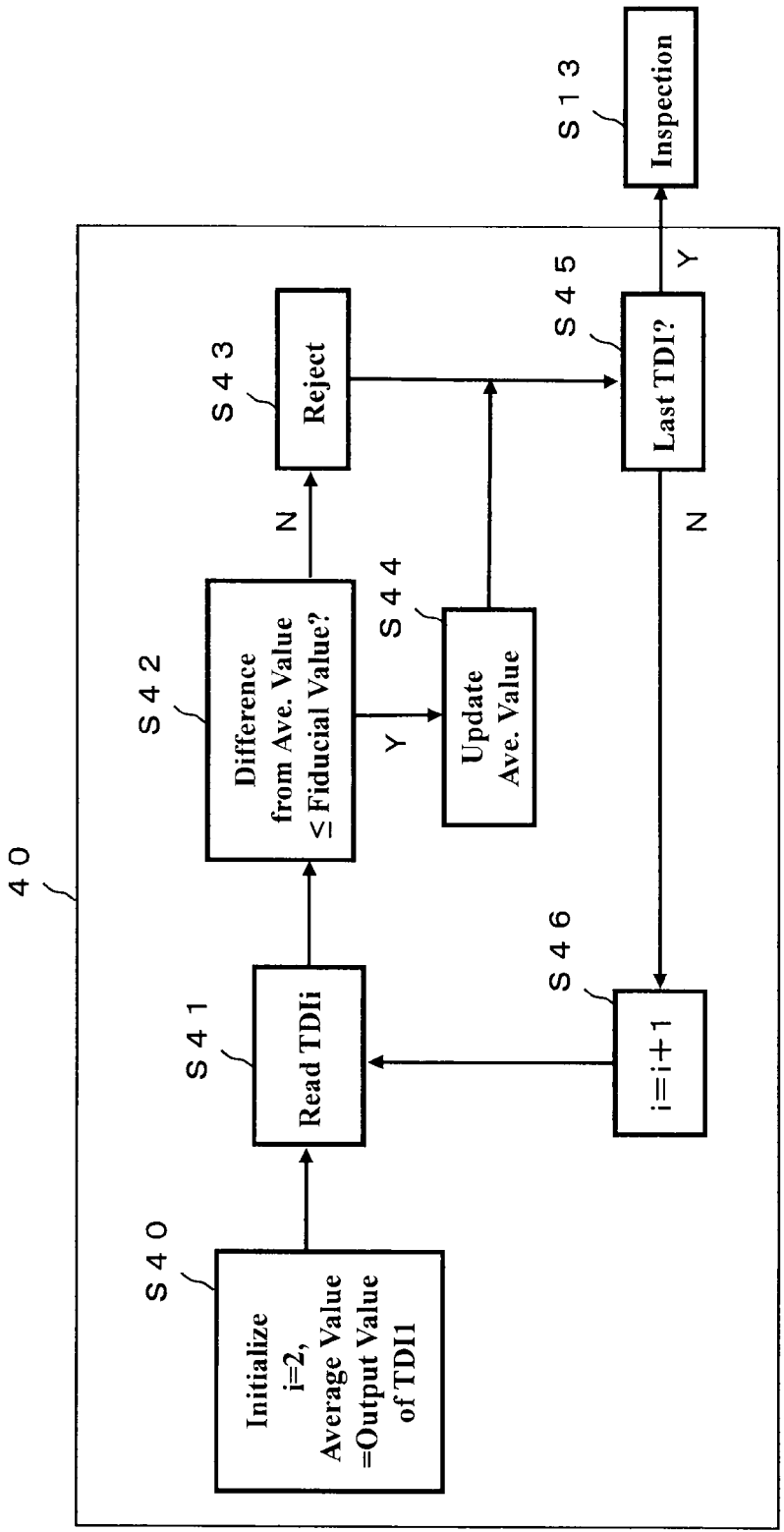
FIG. 9 is a diagram for explanation of a process of sequentially obtaining an average value by comparing a difference between average value and measured value to a fiducial value to thereby obtain a measured image while excluding and discarding false images.

A fourth embodiment shown in FIG. 9 is such that it employs three or more TDI sensors 32a-32n each having two or more stages of line sensors 34. Unlike the above-stated second and third embodiments each being arranged so that the comparison judgment with an output value of the individual TDI sensor 32 is performed after having computed the average value of all the TDI sensors 32a-32n, the fourth embodiment is arranged in a way which follows: as shown in FIG. 9, at N TDI sensors 32a-32n (where N is an integer), an output value of the i-th TDI sensor 32 and an average value using output values of the first to (i−1)th TDI sensors are compared to each other. If the absolute value of a difference therebetween (referred to hereinafter as the average value difference) is not lower than a fiducial value having a predetermined specific value, the output value of the i-th TDI sensor 32 is wasted. If the average value difference is lower than the fiducial value then add thereto the output value of the i-th TDI sensor 32 to thereby update the currently established average value. This process will be repeatedly executed sequentially from an output value of the second TDI sensor 32 up to the last, N-th TDI sensor 32. With this processing, it is possible to eliminate the average calculation process to be first performed in the second and third embodiments; so, it is no longer necessary to wait until completion of outputting of pixel values from all the TDI sensors 32 involved, thereby enabling successful execution of more effective pattern inspection. The fiducial value is set by taking account of the stability of output characteristics of all the TDI sensors of the light-receiving device 30—for example, it is set to about 20 gradation levels.

More specifically, in the false image remover 40, initialization processing is done first while letting a pointer "i" be equal to 2 (i.e., i=2) and letting the average value be equal to an output value of the first TDI sensor 32a with respect to a position of the pattern of the workpiece (at step S40). Then, an output value of the second (i=2) TDI sensor 32b at the position is read out (at step S41) for comparison with the average value. If its average value difference is not lower than the fiducial value (step S42), the output value of the second sensor is discarded (step S43). On the contrary, if the average value difference is lower than the fiducial value (step S42), an output value of the second TDI sensor 32b is added thereto to thereby update the average value with respect to the position of the pattern of the workpiece (step S44). Next, checking is performed to determine whether a presently designated TDI sensor 32 is the last one (step S45). If it is not the last TDI sensor then add one (1) to the pointer i (step S46). Then, an output image of the next TDI sensor 32 at the position of the pattern of the workpiece is read out (step S41), followed by repeated execution of similar processing up to the last TDI sensor 32n with respect to the position of the pattern of the workpiece. The finally obtained average value at the position of the pattern of the workpiece in this way is sent to the comparator unit 24 as a measured image which contains no false images and is then compared with the fiducial image for inspection for pattern defects with respect to the position, and the compared result is output. (step S13). These steps are performed with respect to each position of the pattern of the workpiece.

In the illustrative embodiments stated supra, degradation of image quality due to the mixture of false images occurrable by cosmic radiation or internal electrical sensor noises badly behave to affect the pattern defect detectability and sensitivity in the process of inspecting workpieces being tested; so, in order to increase the sensitivity, it is important to perform such inspection by use of specific sensors of the type outputting no false images. Accordingly, by detecting false images due to cosmic rays falling onto sensors and/or electrical noises generated within these sensors and removing them from accumulated data, it is possible to suppress or minimize pseudo-defects otherwise occurring due to the presence of such noises, thereby making it possible to perform high-sensitivity inspection. The inspection in any one of these embodiments may be performed with respect to every pixel of a measured image or, alternatively, performed only for selected pixels which particularly require higher precision when the need arises or, still alternatively, performed only for certain pixels that are high in probability of false image creation.

Any one of the functional units and circuits plus process steps as stated in the description above may be configured from a computer-executable software program or programs. Alternatively, any one of them is configurable from possible combinations of software programs and hardware components or, still alternatively, combinations with firmware assemblies. In the case of being configured from software programs, these may be prestored or temporarily stored in storage media, such as a magnetic disk drive device, such as a hard disk drive (HDD), magnetic tape recorder device, floppy diskette (FDD) or read-only memory (ROM).

Although the invention has been disclosed and illustrated with reference to particular embodiments, the principles involved are susceptible for use in numerous other embodiments which will be apparent to persons skilled in the art. For example, while in each embodiment the testing position is scanned by driving the XYθ table 116 to move accordingly, this table may be modified to be fixed at a prespecified location while designing its associated optics to move relative thereto. In other words, relative motion methodology is employable for the workpiece table and the optics associated therewith. The invention is, therefore, to be limited only as indicated by the scope of the appended claims.

What is claimed is:

1. A workpiece inspection apparatus comprising:
a measured image generator unit configured to measure a pattern of a workpiece and generate a measured image; and
a comparator unit configured to compare the measured image to a fiducial image, wherein said measured image generator unit includes a light-receiving device having an interconnection of two or more time delay integration (TDI) sensors each being arranged by two or more line sensors each being arranged by two or more pixels, for generating as the measured image an average value of pixel values excluding an abnormal pixel value from pixels of TDI sensors with respect to a position of the pattern of the workpiece,
wherein the light-receiving device has three or more of the TDI sensors, and wherein when calculating as the measured image the average value of pixel values, if an average value difference which is an absolute value of a difference between a pixel value of an i-th TDI sensor and an average value calculated using pixel values of first to (i−1)th TDI sensors is less than or equal to a fiducial value, said measured image generator unit sets as a new pixel value an average value of a pixel value of the i-th TDI sensor and pixel values of the first to (i−1)th TDI sensors, and wherein if the average value difference is not less than the fiducial value then said measured image generator unit performs processing for preventing updating of the average value as the abnormal pixel value and repeats execution of this processing with respect to pixels of all the TDI sensors to thereby obtain an average value and then lets this average value be the measured image.

2. The apparatus according to claim 1, wherein said measured image generator unit generates as the measured image the average value of pixel values excluding as the abnormal pixel value a pixel value greater than a fiducial value from pixels of each TDI sensor with respect to the position.

3. The apparatus according to claim 1, wherein said measured image generator unit uses as a fiducial value a sum of an average value of pixel values and a predetermined value and generates as the measured image the average value of pixel values excluding as the abnormal pixel value a pixel value greater than the fiducial value from pixels of each TDI sensor with respect to the position.

4. The apparatus according to claim 1, wherein the light-receiving device has three or more of the TDI sensors and said measured image generator unit generates as the measured image the average value of pixel values excluding as the abnormal pixel value a pixel value such that an absolute value of a difference between the pixel value and an average value of pixel values of all the three or more TDI sensors at the position is greater than a fiducial value, from pixels of each TDI sensor with respect to the position.

5. A workpiece inspection method comprising:
measuring a pattern of a workpiece using a light-receiving device including an interconnection of two or more time delay integration (TDI) sensors each being arranged by two or more line sensors each being configured from two or more pixels;
generating as a measured image an average value of pixel values excluding an abnormal pixel value from pixels of TDI sensors with respect to a position of the pattern of the workpiece;
and comparing the measured image to a fiducial image to output a compared result,
wherein the light-receiving device has three or more of the TDI sensors, and wherein when calculating as the measured image the average value of pixel values, if an average value difference which is an absolute value of a difference between a pixel value of an i-th TDI sensor and an average value calculated using pixel values of first to (i−1)th TDI sensors is less than or equal to a fiducial value, said generating sets as a new pixel value an average value of a pixel value of the i-th TDI sensor and pixel values of the first to (i−1)th TDI sensors, and wherein if the average value difference is not less than the fiducial value then said generating performs processing for preventing updating of the average value as the abnormal pixel value and repeats execution of this processing with respect to pixels of all the TDI sensors to thereby obtain an average value and then lets this average value be the measured image.

* * * * *